United States Patent
Lee et al.

(10) Patent No.: US 8,879,170 B2
(45) Date of Patent: Nov. 4, 2014

(54) CONDENSING LENS AND LIGHTING DEVICE EQUIPPED WITH SAID CONDENSING LENS

(75) Inventors: Chang Mo Lee, Chuncheon-si (KR); Chang Sub Lee, Seoul (KR); Kyeong Ik Min, Suwon-si (KR); Sang Ho Yoon, Yongin-si (KR); Hyung Jin Kim, Seoul (KR); Jung Kyung Kim, Seoul (KR)

(73) Assignee: Samsung Electronics., Ltd., Suwon-Si (KR)

(*) Notice: Subject to any disclaimer, the term of this patent is extended or adjusted under 35 U.S.C. 154(b) by 191 days.

(21) Appl. No.: 13/417,923

(22) Filed: Mar. 12, 2012

(65) Prior Publication Data
US 2013/0058085 A1    Mar. 7, 2013

(30) Foreign Application Priority Data

Sep. 2, 2011 (KR) ................. 10-2011-0089001

(51) Int. Cl.
| | |
|---|---|
| *G02B 19/00* | (2006.01) |
| *F21V 5/04* | (2006.01) |
| *G02B 5/136* | (2006.01) |
| *F21V 7/00* | (2006.01) |
| *F21Y 101/02* | (2006.01) |
| *F21V 5/00* | (2006.01) |
| *H01L 23/00* | (2006.01) |

(52) U.S. Cl.
CPC . *F21V 5/04* (2013.01); *G02B 5/136* (2013.01); *F21V 7/0091* (2013.01); *F21Y 2101/02* (2013.01); *F21V 5/007* (2013.01); *G02B 19/0047* (2013.01); *G02B 19/0028* (2013.01); *G02B 19/0061* (2013.01); *H01L 24/97* (2013.01); *H01L 2924/12041* (2013.01)
USPC ............................................. 359/733; 359/741

(58) Field of Classification Search
CPC ............ G02B 3/00; G02B 3/08; G02B 5/124; G02B 5/136; G02B 19/0028; G02B 19/0052; G02B 19/0057
USPC .......... 259/733–736, 741–743; 359/733–736, 359/741–743
See application file for complete search history.

(56) References Cited

U.S. PATENT DOCUMENTS

| 2,224,178 A | 12/1940 | Bitner | |
|---|---|---|---|
| 2003/0202241 A1* | 10/2003 | Blumel | ......................... 359/365 |

(Continued)

FOREIGN PATENT DOCUMENTS

| EP | 1600908 A2 | 11/2005 |
|---|---|---|
| JP | 5-281402 A | 10/1993 |

(Continued)

OTHER PUBLICATIONS

Extended European Search Report issued in European Patent Application No. 12159224.0 dated Sep. 11, 2012.

*Primary Examiner* — Darryl J Collins
(74) *Attorney, Agent, or Firm* — McDermott Will & Emery LLP

(57) ABSTRACT

Provided is a condensing lens condensing a light from a light source, and a lighting device equipped with the condensing lens. The condensing lens may enable a light to be selectively incident upon a plurality of first incident portions based on an emission angle, may totally-reflect, using a second incident portion, the light refracted by the plurality of first incident portions, and may refract the totally-reflected light using a third incident portion.

9 Claims, 3 Drawing Sheets

(56) References Cited

U.S. PATENT DOCUMENTS

| | | |
|---|---|---|
| 2004/0080835 A1 | 4/2004 | Chinniah et al. |
| 2005/0152153 A1 | 7/2005 | Amano |
| 2005/0265041 A1 | 12/2005 | Wimbert |
| 2007/0064431 A1 | 3/2007 | Fallahi et al. |
| 2007/0147041 A1 | 6/2007 | Shiratsuchi et al. |
| 2008/0106804 A1 | 5/2008 | Ieda et al. |
| 2009/0086498 A1 | 4/2009 | Condon et al. |

FOREIGN PATENT DOCUMENTS

| | | |
|---|---|---|
| JP | 11-133208 A | 5/1999 |
| JP | 2005-203111 A | 7/2005 |
| JP | 2008-141152 A | 6/2008 |
| JP | 2009-176471 | 8/2009 |
| KR | 10-0756174 B1 | 8/2007 |
| KR | 10-2010-0032294 A | 3/2010 |
| KR | 10-2010-0109336 A | 10/2010 |
| KR | 10-2011-0052118 A | 5/2011 |

\* cited by examiner

CONDENSING LENS AND LIGHTING DEVICE EQUIPPED WITH SAID CONDENSING LENS

CROSS-REFERENCE TO RELATED APPLICATION

This application claims the benefit of Korean Patent Application No. 10-2011-0089001, filed on Sep. 2, 2011, in the Korean Intellectual Property Office, the disclosure of which is incorporated herein by reference.

BACKGROUND

1. Field of the Invention

The present invention relates to a condensing lens and a lighting device equipped with the condensing lens, and more particularly, to a condensing lens that may be embodied as a compact condensing lens using a plurality of condensing lenses using a single component, and a lighting device equipped with the condensing lens.

2. Description of the Related Art

A light emitting diode (LED) refers to a semi-conductor device that emits a light when a current flows, and refers to an electric component that is a PN junction diode including a gallium arsenide (GaAs) and a gallium nitride (GaN) optical semiconductor, and transforms electric energy to light energy.

Recently, blue LEDs and ultraviolet light LEDs embodied using a nitride having superior physical and chemical characteristics have been developed, and a scope of applications for the LED has been expanded since a white light or another monochromatic light may be generated using a blue LED or an ultraviolet LED and a fluorescent substance.

The LED may have features of a long lifespan, a small size, and a light weight, and may operate with a low voltage since the LED has a strong directivity. Also, the LED is robust against impact and vibration, does not require a warm-up time, and is readily operated. Thus, the LED may be utilized for diverse uses. For example, the scope of applications for the LED has been expanded to include a small lighting of a mobile terminal, an indoor illumination, an outdoor illumination, a courtesy light of a car, and backlight of a large liquid crystal display (LCD), and the like.

Conventionally, to condense a light emitted from the LED, a secondary lens is used. A primary incident surface of the secondary lens is configured to be a straight line, the secondary incident surface totally-reflects a light using the primary incident surface so as to condense a light. The conventional scheme may have a drawback in that a size of a lens is large, and an additional cap is manufactured to be used as a single lens.

Therefore, there is a desire for a condensing lens that decreases a size of a lens without a deterioration of condensing performance, and that is capable of being used as a single lens and as a lens array.

SUMMARY

An aspect of the present invention provides a condensing lens capable of forming a compact condensing lens, and a lighting device equipped with the condensing lens.

Another aspect of the present invention also provides a condensing lens capable of forming both a single lens and a lens array as an integrated lens, and a lighting device equipped with the condensing lens.

According to an aspect of the present invention, there is provided a condensing lens that condenses a light from a light source, the condensing lens including a first incidence portion including a plurality of refractive surfaces that selectively enables a light emitted from the light source to be incident, based on an emission angle between the light and an optical axis of the light condensing lens, a second incidence portion including a plurality of totally-reflective surfaces that totally-reflects, in a forward direction, a light having an emission angle greater than a preset angle among lights incident upon the first incidence portion, and a third incidence portion including a plurality of refractive surfaces that enables a light totally-reflected by the second incidence portion and a light that is not totally-reflected by the second incidence portion to be incident, so as to refract the lights in a forward direction.

The first incidence portion may include a first refractive surface disposed at a front side of the light source so that a light having an emission angle less than a first preset angle, is incident upon the first refractive surface, a second refractive surface disposed to surround an outer side of the first refractive surface so that a light having an emission angle greater than or equal to the first preset angle and less than a second preset angle, is incident upon the second refractive surface, and a third refractive surface disposed to surround an outer side of the second refractive surface so that a light having an emission angle greater than or equal to the second preset angle, is incident upon the third refractive surface.

The first refractive surface may be formed to be perpendicular to the optical axis, the second refractive surface may be formed to be parallel to the optical axis, and the third refractive surface may be formed in a shape of an arc of a circle that uses the light source as a point of origin.

The second incidence portion may include a first totally-reflective surface disposed to surround an outer side of the second refractive surface so that a light incident upon the second refractive surface is totally-reflected in a forward direction, and a second totally-reflective surface disposed to surround an outer side of the third refractive surface so that a light incident upon the third refractive surface is totally-reflected in a forward direction, so as to be parallel to the optical axis.

At least one of the first totally-reflective surface and the second totally-reflective surface may be formed in a parabolic shape that uses the light source as the point of origin.

The third incidence portion may include a fourth refractive surface disposed at a front side of the first totally-reflective surface and the first refractive surface so that a light incident upon the first refractive surface and a light totally-reflected by the first totally-reflective surface are incident, and a fifth refractive surface disposed at a front side of the second totally-reflective surface so that a light totally-reflected by the second totally-reflective surface is incident.

The fourth refractive surface may be formed to be a front facing convex curve so that a light incident upon the first refractive surface and a light totally-reflected by the first totally-reflective surface are refracted so as to be parallel to the optical axis, and the fifth refractive surface may be formed to be perpendicular to the optical axis so that a light totally-reflected by the second totally-reflective surface is refracted so as to be parallel to the optical axis.

According to another aspect of the present invention, there is provided a lighting device, including a condensing lens, a light emitting device disposed on a back side of the condensing lens so as to provide a light to the condensing lens, and a circuit substrate containing the light emitting device, and the condensing lens includes a first incidence portion including a plurality of refractive surfaces that selectively enables a light emitted from the light source to be incident, based on an emission angle between the light and an optical axis of the light condensing lens, a second incidence portion including a plurality of totally-reflective surfaces that totally-reflects, in a forward direction, a light having an emission angle greater than a preset angle among lights incident upon the first incidence portion, and a third incidence portion including a plurality of refractive surfaces that enables a light totally-reflected by the second incidence portion and a light that is not totally-reflected by the second incidence portion to be incident, so as to refract the lights in a forward direction.

According to still another aspect of the present invention, there is provided a lighting device, including a lens cover in which a condensing lens is formed, a light emitting device disposed on a back side of the condensing lens so as to provide a light to the condensing lens, and a circuit substrate containing the light emitting device, and a plurality of light emitting devices is disposed on different locations on the circuit substrate, and condensing lenses are formed on locations corresponding to the light emitting devices, in the lens cover. Also, the condensing lens includes a first incidence portion including a plurality of refractive surfaces that selectively enables a light emitted from the light source to be incident, based on an emission angle between the light and an optical axis of the light condensing lens, a second incidence portion including a plurality of totally-reflective surfaces that totally-reflects, in a forward direction, a light having an emission angle greater than a preset angle among lights incident upon the first incidence portion, and a third incidence portion including a plurality of refractive surfaces that enables a light totally-reflected by the second incidence portion and a light that is not totally-reflected by the second incidence portion to be incident, so as to refract the lights in a forward direction.

Additional aspects, features, and/or advantages of the invention will be set forth in part in the description which follows and, in part, will be apparent from the description, or may be learned by practice of the invention.

EFFECT

Embodiments of the present invention may provide a condensing lens and a lighting device equipped with the condensing lens that may form a compact condensing lens and thus, the lighting device is minimized. The condensing lens may be formed to be compact without a deterioration of condensing performance and thus, the lighting device may be formed to be small, a degree of freedom in design may be high, and a space for installation may be readily obtained.

Embodiments of the present invention may provide a condensing lens and a lighting device equipped with the condensing lens. The condensing lens may be used as a single lens so as to be included in a single light emitting device, and may be used as an integrated lens integrating a plurality of condensing lenses. That is, a scalability of the condensing lens may be improved.

The integrated lens may be a lens array integrating a plurality of condensing lenses as a single component and thus, a manufacturing cost may decrease and a working process may be shorten when a plurality of light emitting devices are used.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
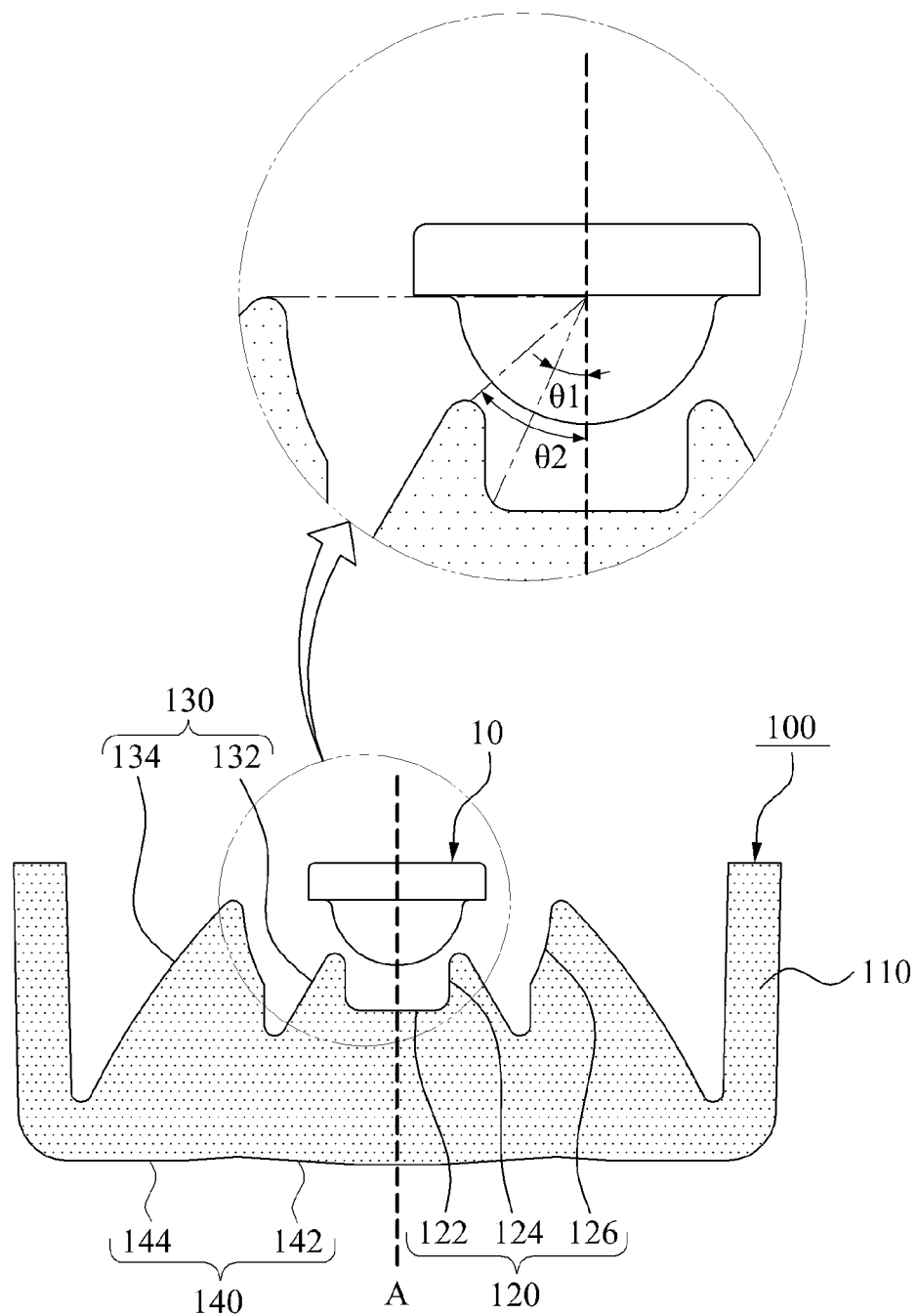
FIG. 1 is a cross-sectional diagram illustrating a condensing lens according to an embodiment of the present invention.

Reference will now be made in detail to embodiments of the present invention, examples of which are illustrated in the accompanying drawings, wherein like reference numerals refer to the like elements throughout. Embodiments are described below to explain the present invention by referring to the figures.

Figure 2:
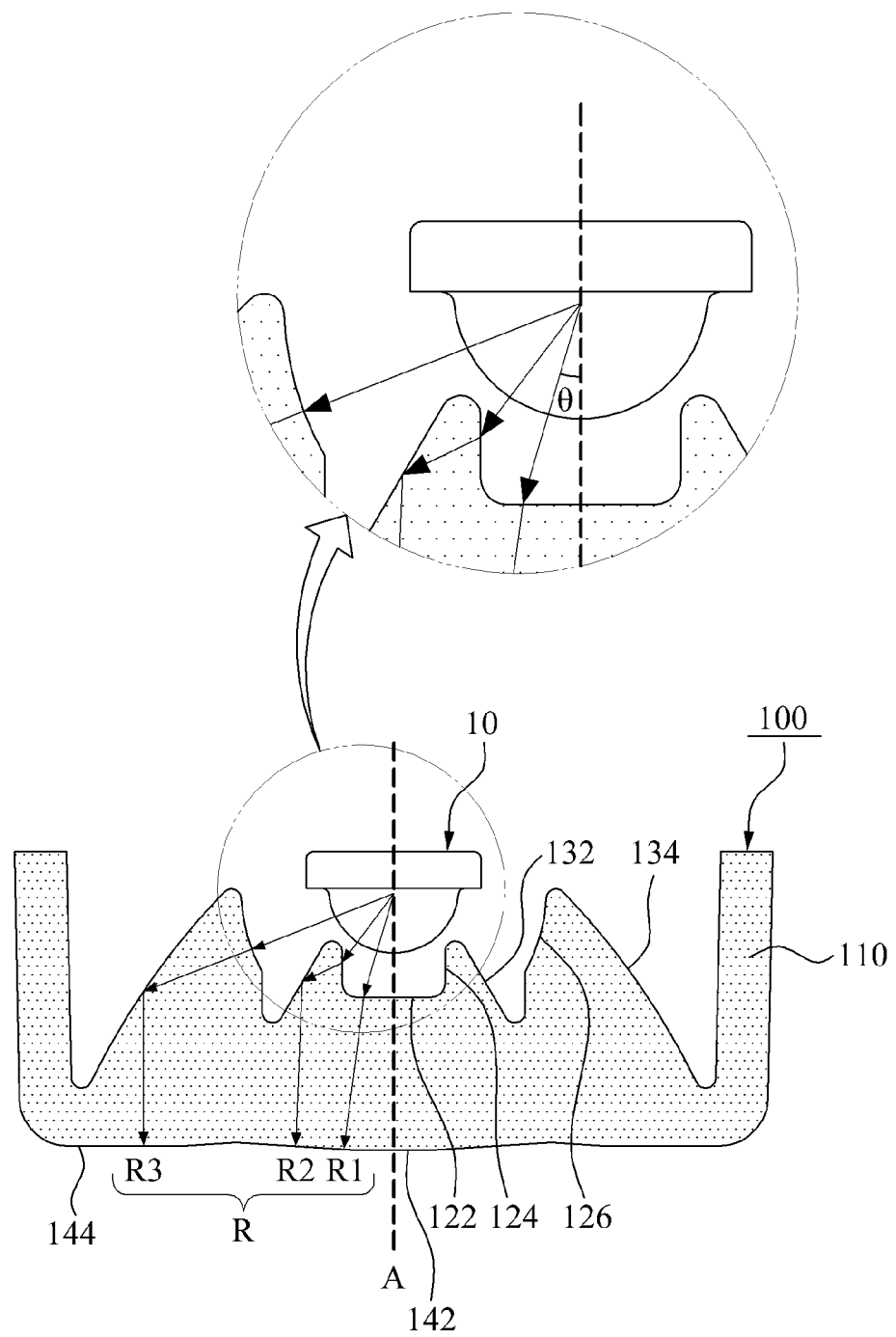
FIG. 2 is a diagram illustrating a state in which a light from a light source is condensed by the condensing lens of FIG. 1.

FIG. 1 illustrates a cross-section of a condensing lens according to an embodiment of the present invention, and FIG. 2 illustrates a state in which a light from a light source is condensed by the condensing lens of FIG. 1.

Referring to FIGS. 1 and 2, a condensing lens 100 may refer to an optical member that condenses a light (R) from the light source 10, and may include a condensing lens body 110, a first incident portion 120, a second incident portion 130, and a third incident portion 140.

The light source 10 may refer to an object that generates R, and generally, a light emitting device may be used as the light source 10. Hereinafter, the embodiments may use the light source 10 corresponding to a type of a light emitting diode (LED) package including a fluorescent substance disposed around a light emitting device that transforms a current to a light. However, examples of the light source 10 may not be limited thereto, and varied light sources may be used based on a design condition.

The condensing lens body 110 may be a member disposed at a front side of the light source 10, may be formed of a transparent material through which R is able to pass. The condensing lens body 110 may be formed to cover the light source 10.

Referring to FIGS. 1 and 2, the first incident portion 120 may include a plurality of refractive surfaces, for example, a first refractive surface 122, a second refractive surface 124, and a third refractive surface 126, which enables R to be selectively incident based on an emission angle θ formed between R emitted from the light source 10 and an optical axis (A) of the condensing lens 100.

Here, A may refer to a path of R where a double refraction does not occur or an axis that creates no difference in terms of optics when an optical system is rotated. As illustrated in FIGS. 1 and 2, A of the condensing lens 100 may be formed to be in a shape of a straight line in a direction from a center to a forward direction.

Also, the emission angle θ may refer to an angle formed between R and A. Therefore, as the emission angle θ of R decreases, R is emitted in a direction close to a forward direction. Transitively, as the emission angle θ of R increases, R is emitted to be inclined with respect to a left direction or a right direction.

According to an aspect of the present invention, the first incident portion 120 may include the first refractive surface 122, the second refractive surface 124, and the third refractive surface 126. Although the first refractive surface 122, the second refractive surface 124, and the third refractive surface 126 are disposed in a circular shape based on A at a back side of the condensing lens body 110, the configuration is not limited thereto and may be variously modified based on a design condition and situation.

The first refractive surface 122 may be an incident surface upon which a first light (R1) having an emission angle θ less than a first preset angle (θ1) is incident, among R from the light source 10. The refractive surface 122 may be disposed to face a front side of the light source 10. The first refractive surface 122 may be formed to be perpendicular to A. For example, the first refractive surface 122 may be formed to be a circular shape of which a point of origin is penetrated by A.

The second refractive surface 124 may be an incident surface upon which a second light (R2) having an emission angle θ greater than or equal to θ1 and less than a second preset angle (θ2), is incident among R from the light source 10. The second refractive surface 124 may be disposed to surround an outer side of the first refractive surface 122. The second refractive surface 124 may be formed to be parallel to the optical axis. For example, the second refractive surface 124 may be formed, along an edge of the first refractive surface, in a cylindrical shape parallel to A.

The third refractive surface 126 may be an incident surface upon which a third light (R3) having an emission angle θ greater than or equal to θ2, is incident among R from the light source 10. The third refractive surface 126 may be disposed to surround an outer side of the second refractive surface 124. The third refractive surface 126 may be formed in a shape of an arc of a circle that uses the light source 10 as a point of origin. For example, the third refractive surface 126 may be formed in a shape of a pipe that surrounds the second refractive surface 124, and a portion on which R3 is incident may be formed in a globular surface having the light source 10 as a point of origin.

Referring to FIGS. 1 and 2, the second incident portion 130 may include a plurality of totally-reflective surfaces, for example, a first totally-reflective surface 132, and a second totally-reflective surface 134, which totally-reflects R2 and R3 that have emission angles θ greater than θ1, among R incident upon the first incident portion 120, in a forward direction.

The second incident portion 130 may include the first totally-reflective surface 132 and the second totally-reflective surface 134.

The first totally-reflective surface 132 may be a surface that totally-reflects R2 incident upon the second refractive surface 124, in a forward direction. The first totally-reflective surface 132 may be disposed to surround an outer side of the second refractive surface 124.

The second totally-reflective surface 134 may be a surface that totally-reflects R3 incident upon the third refractive surface 126, in a forward direction, so as to be parallel to A. The second totally-reflective surface 134 may be formed to surround an outer side of the third refractive surface 126.

At least one of the first totally-reflective surface 132 and the second totally-reflective surface 134 may be formed in a parabolic shape that uses the light source 10 as a point of origin. Hereinafter, embodiments may describe that both the first totally-reflective surface 132 and the totally-reflective surface 134 are formed in a parabolic shape.

Referring to FIGS. 1 and 2, the third incident portion 140 may include a plurality of refractive surfaces, for example, a fourth refractive surface 142 and a fifth refractive surface 144, which enables R2 and R2 totally-reflected by the second incident portion 130 and R1 that is not totally-reflected by the second incident portion 130, to be incident, so as to refract R1, R2, and R3 in a forward direction to be parallel to A.

According to an aspect of the present invention, the third incident portion 140 may include the fourth refractive surface 142 and the fifth refractive surface 144.

The fourth refractive surface 142 may be a surface upon which R1 incident upon the first refractive surface 122 and R2 totally-reflected by the first totally-reflective surface 132, are incident. The forth refractive surface 142 may be disposed at a front side of the first refractive surface 122 and the first totally-reflective surface 132. The fourth refractive surface 142 may be formed to be a front facing convex curve, so as to refract R1 and R2 to be parallel to A.

The fifth refractive surface 144 may be a surface upon which R3 reflected by the second totally-reflective surface 134 is incident. The fifth refractive surface 144 may be disposed at a front side of the second totally-reflective surface 134. The fifth refractive surface 144 may be formed to be perpendicular to A, so as to refract R3 to be parallel to A.

Hereinafter, functions of the condensing lens 100 configured as described in the foregoing will be provided.

Among R emitted from the light source 10, R1 is incident upon the first refractive surface 122 of the first incident portion 120 at an emission angle θ less than θ1. R1 may be primarily refracted by the first refractive surface 122 in a direction in which the emission angle θ decreases.

Subsequently, R1 may pass through the condensing lens body 110 and may be incident upon the fourth refractive surface 142 of the third incident portion 140. R1 may be secondarily refracted by the fourth refractive surface 142 in a direction in which the emission angle θ decreases. In the process, R1 may be emitted, in a forward direction of the condensing lens 100, so as to be parallel to A.

Among R emitted from the light source 10, R2 may be incident upon the second refractive surface 124 of the first incident portion 120 at an emission angle θ greater than or equal to θ1 and less than θ2. The R2 may be primarily refracted by the second refractive surface 124 in a direction in which the emission angle θ increases.

Subsequently, R2 may pass through the condensing lens body 110, and may be reflected by the first totally-reflective surface 132 of the second incident portion 130 in a direction in which the emission angle θ decreases. In this example, R2 may be totally-reflected by the first totally-reflective surface 132 in a forward direction, so as to be parallel to A.

R2 totally-reflected by the first totally-reflective surface 132 may pass through the condensing lens body 110, and may be incident upon the fourth refractive surface 142 of the third incident portion 140. R2 may be secondarily refracted by the fourth refractive surface 142 in a direction in which the emission angle θ decreases. In the process, R2 may be emitted in a forward direction of the condensing lens 100, so as to be parallel to A.

Among R emitted from the light source 10, R3 may be incident upon the third refractive surface 126 of the first incident portion 120 at an emission angle θ greater than or equal to θ2. The emission angle θ of R3 may not be refracted by the third refractive surface 126 since the third refractive surface 126 is formed in a shape of an arc of a circle of which a point of origin is the light source 10 and R3 is incident upon the third refractive surface 126 to be perpendicular to the third refractive surface 126.

Subsequently, R3 may pass through the condensing lens body 110 and may be reflected by the second totally-reflective surface 134 of the second incident portion 130 in a direction in which the emission angle θ decreases. In this example, R3 may be reflected by the second totally-reflective surface 134 in a forward direction, so as to be parallel to A.

R3 totally-reflected by the second totally-reflective surface 134 may pass through the condensing lens body 110 and may be incident upon the fifth refractive surface 144 of the third incident portion 140. R3 may not be refracted by the fifth refractive surface 144 and may be emitted, as is, in a forward direction of the condensing lens 100 since the fifth refractive surface 144 is formed in a planar shape perpendicular to A, and R3 is vertically incident upon the fifth refractive surface 144.

As described in the foregoing, R of the light source 10 may be refracted or reflected via different paths based on an emission angle θ and thus, may be emitted in a forward direction of the condensing lens 100 so as to be parallel to A, and may be formed to be smaller than a conventional condensing lens.

Figure 3:
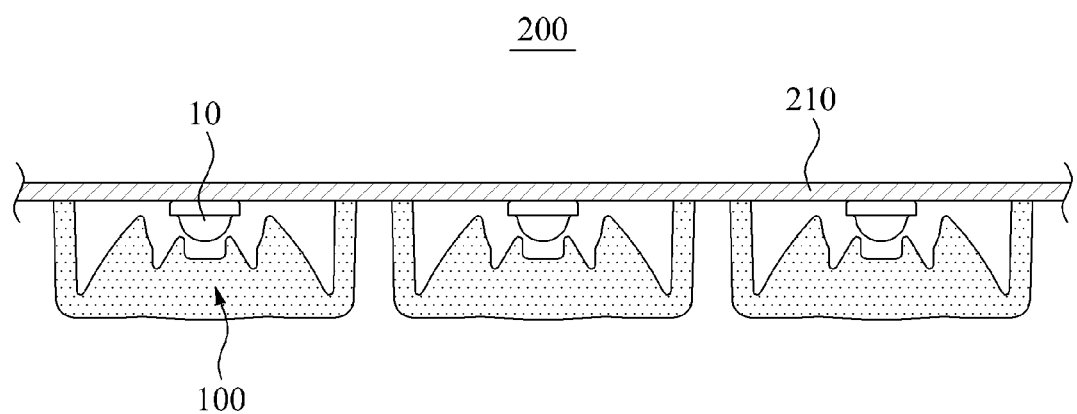
FIG. 3 is a diagram illustrating an example of a lighting device equipped with a condensing lens according to an embodiment of the present invention.

FIG. 3 illustrates a lighting device 200 equipped with a condensing lens according to an embodiment of the present invention. For ease of reference, the same reference numerals used in FIG. 3 refer to the same elements in FIGS. 1 and 2.

Referring to FIG. 3, the lighting device 200 may include the condensing lens 100, a light emitting device 10, and a circuit substrate 210. The condensing lens 100 may have a similar configuration to the configuration 100 of FIGS. 1 and 2, and the light emitting device 10 may correspond to the light source 10 of FIGS. 1 and 2 and thus, detailed descriptions with respect to the condensing lens 100 and the light emitting device 10 will be omitted for conciseness.

The light emitting device 10 may be disposed at a back side of the condensing lens 100, and may be contained in the circuit substrate 210. The circuit substrate 210 may be equipped with a circuit to control an operation of the light emitting device 10. Also, the condensing lens 100 may also be mounted on the circuit substrate 210, stably.

The lighting device 200 may include a plurality of light emitting devices 10 disposed on different locations on the circuit substrate 210, and each light emitting device 10 is equipped with the condensing lens 100. That is, the condensing lens 100 may be used as a single lens that is installed in each of the plurality of light emitting devices 10.

The condensing lens 100 of the lighting device 200 may be configured to be compact and thus, the lighting device 200 may be formed to be smaller than a conventional lighting device.

Figure 4:
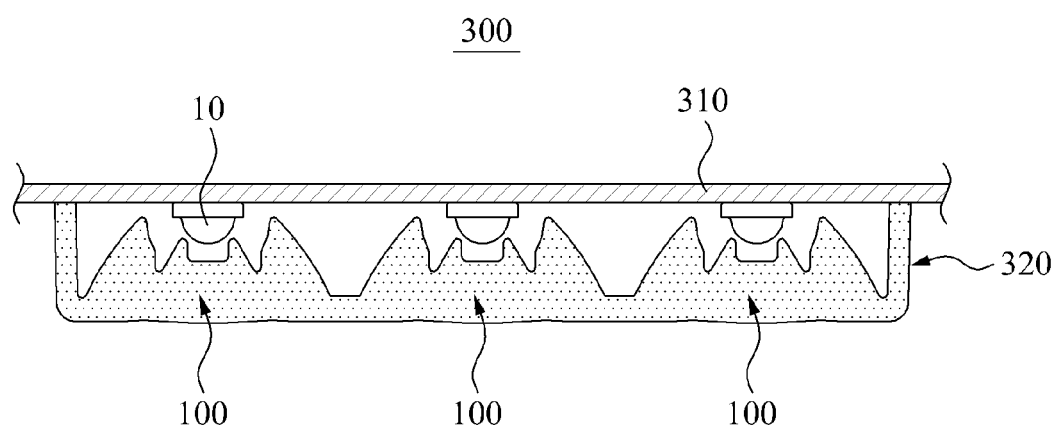
FIG. 4 is a diagram illustrating another example of a lighting device equipped with a condensing lens according to an embodiment of the present invention.

FIG. 4 illustrates a lighting device 300 equipped with a condensing lens according to another embodiment of the present invention. For ease of reference, the same reference numerals used in FIG. 4 refer to the same elements in FIGS. 1 and 2.

Referring to FIG. 4, the lighting device 300 may include a lens cover 320, a light emitting device 10, and a circuit substrate 310.

A plurality of condensing lenses 100 may be formed on the lens cover 320. The condensing lens 100 may have a like configuration as the condensing lens 100 of FIGS. 1 and 2, the light emitting device 10 may correspond to the light source 10 in FIGS. 1 and 2 and thus, detailed descriptions with respect to the condensing lens 100 and the light emitting device 10 will be omitted for conciseness.

The light emitting device 10 may be disposed at a back side of the condense 100, and a plurality of light emitting devices 10 may be mounted on the circuit substrate 310. The circuit substrate 310 may be equipped with a circuit to control an operation of the light emitting device 10. Also, the lens cover 320 may be mounted on the circuit substrate 310, stably.

The lighting device 300 may include the plurality of light emitting devices 10 disposed on different locations on the circuit substrate 310, and the plurality of light emitting devices 10 may be formed to have a structure covered by the lens cover 320. Condensing lenses 100 may be formed on locations in the lens cover 320, corresponding to the plurality of light emitting devices 10, respectively. Accordingly, the lens cover 320 may be an integrated lens, for example, a lens array, integrating the plurality of condensing lenses 100 and thus, a total number of components and assemblers included in the lighting device 300 may be reduced.

Since the lens cover 320 of the lighting device 300 may be configured to be compact and thus, the lighting device 300 may be formed to be smaller than a conventional lighting device.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A condensing lens that condenses a light from a light source, the condensing lens comprising:
    a first incidence portion including a plurality of refractive surfaces that selectively enables a light emitted from the light source to be incident, based on an emission angle between the light and an optical axis of the light condensing lens;
    a second incidence portion including a plurality of totally-reflective surfaces that totally-reflects, in a forward direction, a light having an emission angle greater than a preset angle among lights incident upon the first incidence portion; and
    a third incidence portion including a plurality of refractive surfaces that enables a light totally-reflected by the second incidence portion and a light that is not totally-reflected by the second incidence portion to be incident, so as to refract the lights in a forward direction,
    wherein the first incidence comprises:
    a first refractive surface disposed at a front side of the light source so that a light having an emission angle less than a first preset angle, is incident upon the first refractive surface;
    a second refractive surface disposed to surround an outer side of the first refractive surface so that a light having an emission angle greater than or equal to the first preset angle and less than a second preset angle, is incident upon the second refractive surface; and
    a third refractive surface disposed to surround an outer side of the second refractive surface so that a light having an emission angle greater than or equal to the second preset angle, is incident upon the third refractive surface,
    wherein the first refractive surface is formed to be perpendicular to the optical axis.

2. The lens of claim 1, wherein the second refractive surface is formed to be parallel to the optical axis.

3. The lens of claim 1, wherein the third refractive surface is formed in a shape of an arc of a circle that uses the light source as a point of origin.

4. The lens of claim 1, wherein the second incidence portion comprises:
    a first totally-reflective surface disposed to surround an outer side of the second refractive surface so that a light incident upon the second refractive surface is totally-reflected in a forward direction; and
    a second totally-reflective surface disposed to surround an outer side of the third refractive surface so that a light incident upon the third refractive surface is totally-reflected in a forward direction, so as to be parallel to the optical axis.

5. The lens of claim 4, wherein at least one of the first totally-reflective surface and the second totally-reflective surface is formed in a parabolic shape that uses the light source as the point of origin.

6. A condensing lens that condenses a light from a light source, the condensing lens comprising:
a first incidence portion including a plurality of refractive surfaces that selectively enables a light emitted from the light source to be incident, based on an emission angle between the light and an optical axis of the light condensing lens;
a second incidence portion including a plurality of totally-reflective surfaces that totally-reflects, in a forward direction, a light having an emission angle greater than a preset angle among lights incident upon the first incidence portion; and
a third incidence portion including a plurality of refractive surfaces that enables a light totally-reflected by the second incidence portion and a light that is not totally reflected by the second incidence portion to be incident, so as to refract the lights in a forward direction,
wherein the first incidence portion comprises:
a first refractive surface disposed at a front side of the light source so that a light having an emission angle less than a first preset angle, is incident upon the first refractive surface;
a second refractive surface disposed to surround an outer side of the first refractive surface so that a light having an emission angle greater than or equal to the first preset angle and less than a second preset angle, is incident upon the second refractive surface; and
a third refractive surface disposed to surround an outer side of the second refractive surface so that a light having an emission angle greater than or equal to the second preset angle, is incident upon the third refractive surface,
wherein the second incidence portion comprises:
a first totally-reflective surface disposed to surround an outer side of the second refractive surface so that a light incident upon the second refractive surface is totally reflected in a forward direction; and
a second totally-reflective surface disposed to surround an outer side of the third refractive surface so that a light incident upon the third refractive surface is totally reflected in a forward direction, so as to be parallel to the optical axis,
wherein the third incidence portion comprises:
a fourth refractive surface disposed at a front side of the first totally-reflective surface and the first refractive surface so that a light incident upon the first refractive surface and a light totally-reflected by the first totally-reflective surface are incident; and
a fifth refractive surface disposed at a front side of the second totally-reflective surface so that a light totally-reflected by the second totally-reflective surface is incident.

7. The lens of claim 6, wherein the fourth refractive surface is formed to be a front facing convex curve so that a light incident upon the first refractive surface and a light totally-reflected by the first totally-reflective surface are refracted so as to be parallel to the optical axis.

8. The lens of claim 6, wherein the fifth refractive surface is formed to be perpendicular to the optical axis so that a light totally-reflected by the second totally-reflective surface is refracted so as to be parallel to the optical axis.

9. The lens of claim 6, wherein at least one of the first totally-reflective surface and the second totally-reflective surface is formed in a parabolic shape that uses the light source as the point of origin.

* * * * *